(12) United States Patent
Jia et al.

(10) Patent No.: US 10,273,572 B2
(45) Date of Patent: Apr. 30, 2019

(54) HEATING CHAMBER AND SEMICONDUCTOR PROCESSING APPARATUS

(71) Applicant: Beijing NAURA Microelectronics Equipment Co., Ltd., Beijing (CN)

(72) Inventors: Qiang Jia, Beijing (CN); Mengxin Zhao, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 15/533,573

(22) PCT Filed: Dec. 26, 2014

(86) PCT No.: PCT/CN2014/095084
§ 371 (c)(1),
(2) Date: Jun. 6, 2017

(87) PCT Pub. No.: WO2016/095259
PCT Pub. Date: Jun. 23, 2016

(65) Prior Publication Data
US 2017/0321319 A1    Nov. 9, 2017

(30) Foreign Application Priority Data
Dec. 17, 2014  (CN) .......................... 2014 1 0788850

(51) Int. Cl.
*C23C 14/50*     (2006.01)
*C23C 14/54*     (2006.01)
(Continued)

(52) U.S. Cl.
CPC .......... *C23C 14/541* (2013.01); *C23C 14/02* (2013.01); *C23C 14/50* (2013.01);
(Continued)

(58) Field of Classification Search
CPC ..... C23C 14/541; C23C 14/50; H05B 3/0047; H01L 21/67757; H01L 21/67109; H01L 21/67248
See application file for complete search history.

(56) References Cited

U.S. PATENT DOCUMENTS 3,395,241 A * 7/1968 Roman .................. H05B 3/145
                                                           219/390
5,187,771 A * 2/1993 Uchida ................... C23C 16/46
                                                           118/725
(Continued)

FOREIGN PATENT DOCUMENTS

CN        1420978 A      5/2003
CN      102808152 A     12/2012
(Continued)

OTHER PUBLICATIONS

The World Intellectual Property Organization (WIPO) International Search Report for PCT/CN2014/0950821 dated Mar. 27, 2015 6 Pages.

*Primary Examiner* — Nathaniel Herzfeld
(74) *Attorney, Agent, or Firm* — Anova Law Group, PLLC (57) ABSTRACT

A heating chamber and a semiconductor processing apparatus are provided. The heating chamber includes: a heating barrel (17) disposed in the heating chamber and located above a substrate transferring window; an annular heating device (15) disposed around an inner side of the heating barrel and configured to radiate heat from a periphery to an interior of the heating barrel; a substrate cassette (14) configured to bear multiple layers of substrates and allow the multiple layers of substrates to be arranged at intervals in an axial direction of the heating barrel; and a substrate cassette lifting device (13) configured to drive the substrate cassette to move up into an internal spare defined by the annular (Continued)

heating device, or move down to a position corresponding to the substrate transferring window.

18 Claims, 6 Drawing Sheets

(51) Int. Cl.
    *H01L 21/67*     (2006.01)
    *H01L 21/677*     (2006.01)
    *H05B 3/00*     (2006.01)
    *C23C 14/02*     (2006.01)
    *F27B 17/00*     (2006.01)

(52) U.S. Cl.
    CPC ...... *F27B 17/0025* (2013.01); *H01L 21/6719* (2013.01); *H01L 21/67109* (2013.01); *H01L 21/67115* (2013.01); *H01L 21/67248* (2013.01); *H01L 21/67757* (2013.01); *H05B 3/0047* (2013.01)

(56) References Cited

U.S. PATENT DOCUMENTS

| | | | | |
|---|---|---|---|---|
| 5,324,920 A * | 6/1994 | Nakao | ..................... | C30B 25/10 219/385 |
| 5,506,389 A * | 4/1996 | Hidano | ................... | C23C 16/46 118/50.1 |
| 5,651,670 A | 7/1997 | Okase | | |
| 6,005,225 A * | 12/1999 | Kowalski | .......... | H01L 21/67098 118/50.1 |
| 6,111,225 A * | 8/2000 | Ohkase | ............. | H01L 21/67109 118/724 |
| 6,228,174 B1 * | 5/2001 | Takahashi | ........... | C23C 16/4584 118/724 |
| 6,369,361 B2 * | 4/2002 | Saito | ........................ | C30B 31/12 118/50.1 |
| 6,462,310 B1 * | 10/2002 | Ratliff | .................... | C23C 16/455 118/50.1 |
| 2005/0082281 A1 * | 4/2005 | Uemori | ............. | H01L 21/67109 219/539 |
| 2007/0084847 A1 * | 4/2007 | Koshimizu | ............... | F27B 5/04 219/390 |
| 2009/0223448 A1 * | 9/2009 | Sakai | .................... | C23C 16/405 118/715 |
| 2011/0021039 A1 * | 1/2011 | Murata | ............. | H01L 21/67109 438/795 |
| 2013/0340224 A1 * | 12/2013 | Jang | ........................ | B23P 25/00 29/33 R |

FOREIGN PATENT DOCUMENTS

| | | |
|---|---|---|
| CN | 102839362 A | 12/2012 |
| JP | 2011134793 A | 7/2011 |

* cited by examiner

HEATING CHAMBER AND SEMICONDUCTOR PROCESSING APPARATUS

CROSS-REFERENCE TO RELATED APPLICATIONS

This application is a national phase entry under 35 U.S.C. § 371 of International Application No. PCT/CN2014/095084, filed on Dec. 26, 2014, which claims priority to and benefits of Chinese Patent Application Serial No. 201410788850.2, filed with the State Intellectual Property Office of P. R. China on Dec. 17, 2014, the entire content of all of which is incorporated herein by reference.

FIELD OF THE DISCLOSURE

The present disclosure relates to the field of semiconductor apparatus manufacturing, and more particularly, relates to a heating chamber and a semiconductor processing apparatus.

BACKGROUND

The Physical Vapor Deposition (hereinafter referred to as PVD) technique is a processing technique commonly used in the field of microelectronics, and for example, PVD may be used to process a copper interconnection layer in an integrated circuit. Fabrication of a copper interconnection layer mainly includes steps such as degassing, pre-cleaning, deposition of Ta(N), and deposition of Cu, where the step of degassing is for removing water vapor and other volatile impurities on a to-be-processed workpiece such as a substrate. When the step of degassing is implemented, a heating chamber needs to be utilized to heat the to-be-processed workpiece such as a substrate to a temperature above 300° C.

Figure 1:
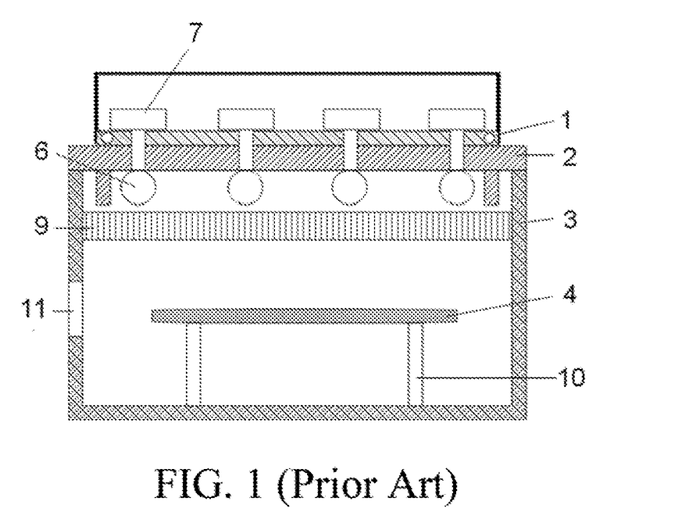
FIG. 1 is a structural schematic diagram of an existing heating chamber.

FIG. 1 is a structural schematic diagram of an existing beating chamber. Referring to FIG. 1, the heating chamber includes a barrel-shaped shielding member 3 and a reflection plate 2 disposed at the top thereof. Further, a sealed quartz window 9 is disposed inside the heating chamber, and via the sealed quartz window 9, the heating chamber is divided into an upper sub-chamber and a lower sub-chamber. The upper sub-chamber has an atmospheric environment, and the lower sub-chamber has a vacuum environment. Further, supporting pins 10 are configured at a bottom of the lower sub-chamber for bearing a substrate 4. Heating bulbs 6 are disposed inside the upper sub-chamber, and the heating bulbs 6 are fastened to a bulb installation plate 1 through bulb installation sockets 7. Further, the heating bulbs 6 are located below the reflection plate 2 to heat the substrate 4 by way of thermal radiation via the sealed quartz window 9. Further, a substrate transferring window 11 for transferring the substrate 4 into or out of the heating chamber is disposed in the shielding member 3.

In practical applications of the aforementioned heating chamber, the following issues inevitably exist.

First, because the heating bulbs 6 are arranged discretely, the heat radiated by the heating bulbs 6 to each area of the substrate 4 is not uniform, rendering uneven temperature in each area of the substrate 4, thereby causing the process to be non-uniform. Further, in the process of heating the substrate 4, because a marginal area of the substrate 4 is closer to the shielding member 3, a heat dissipation rate of the marginal area is higher than a heat dissipation rate of a central area of the substrate 4. Accordingly, a difference in the temperature exists between the central area and the marginal area of the substrate 4, which further lowers the processing uniformity.

Second, because each time the aforementioned heating chamber can only perform a degassing operation on limited a few substrates, and a relatively long time (nearly 200 seconds, which is four times a duration of a processing process such as a process for a copper barrier layer) is required, the number of substrates that can be processed per unit time is relatively small. Further, because the ratio occupied by the processing time of the step of degassing in the total processing time is the highest for certain PVD processes, the step of degassing becomes a key factor that limits the capacity of the whole PVD device. Accordingly, a beating chamber with high efficiency is currently highly desired to improve the capacity of the PVD device.

SUMMARY OF THE DISCLOSURE

The present disclosure is intended to at least solve one of the technical issues existing in the prior art. A heating chamber and a semiconductor processing apparatus are provided, which not only realizes simultaneous heating of multiple layers of substrates arranged at intervals in a vertical direction all at once to multiply the number of substrates processed per unit time, but also ensures, the temperature uniformity between each area of a substrate and between each substrate mare easily, thereby improving the processing uniformity.

To achieve the object of the present disclosure, a heating chamber is provided. The heating chamber has a vacuum environment and includes a substrate transferring window for a substrate to pass through. The heating chamber includes: a heating barrel disposed in the heating chamber and located above the substrate transferring window; an annular heating device, fixedly connected to the heating barrel, winding around an inner side of the heating barrel, and configured to radiate heat from a periphery of the heating barrel to an interior of the heating barrel; a substrate cassette, configured to bear multiple layers of substrates and arrange the multiple layers of substrates at intervals in an axial direction of the heating barrel; and a substrate cassette lifting device, configured to drive the substrate cassette to move up into an internal space defined by the annular heating device, or move down to a position corresponding to the substrate transferring window.

More specifically, the annular heating device includes: a plurality of heating tubes arranged along a circumferential direction of the heating barrel to form a barrel-shaped heat source; a supporting assembly configured to fasten the plurality of heating tubes; and an electricity introduction assembly configured to transmit an electric current to each heating tube.

Further, the supporting assembly includes an upper inner ring, a lower inner ring and an inner ring connector, and the upper inner ring, the lower inner ring, and the inner ring connector are all made of an insulation material. The upper inner ring and the lower inner ring are oppositely arranged in the axial direction of the heating barrel, each heating tube is located between the upper inner ring and the lower inner ring and is fixedly connected to the upper inner ring and the lower inner ring, respectively; the number of inner ring connectors may be various, and the inner ring connectors are disposed at intervals along a circumferential direction of the heating barrel; and each inner ring connector is connected to the upper inner ring and the lower inner ring, respectively, and supports the upper inner ring and the lower inner ring.

Further, the electricity introduction assembly includes an upper conductive ring, a lower conductive ring, and an electrode group. The upper conductive ring is disposed around an external side of the upper inner ring, and the lower conductive ring is disposed around an external side of the lower inner ring; an anode and a cathode of each heating tube are electrically connected to the upper conductive ring and the lower conductive ring, respectively; the electrode group includes an anode electrode and a cathode electrode, inner terminals of the anode electrode and the cathode electrode are correspondingly connected to the anode and the cathode of each heating tube simultaneously through the upper conductive ring and the lower conductive ring, and outer terminals of the anode electrode and the cathode electrode are located outside of the heating barrel.

Further, the plurality of heating tubes are evenly divided into at least two heating tube groups; and correspondingly, the upper conductive ring and the lower conductive ring are respectively divided into at least two upper half-rings and at least two lower half-rings that are not in contact with each other; the number of the electrode groups is consistent with the number of the heating tube groups; the anode and the cathode of each beating tube in each heating tube group are respectively and electrically connected to the upper half-ring and the lower half-ring that are in one-to-one correspondence with the heating tube group; and inner terminals of the anode electrode and the cathode electrode of each electrode group are electrically connected to the upper half-ring and the lower half-ring that are in one-to-one correspondence with the electrode group.

Further, the electricity introduction assembly further includes: at least two upper insulation pieces, where each upper insulation piece is disposed in a gap between two adjacent upper half-rings, thereby allowing the two adjacent upper half-rings to be electrically insulated from each other; and at least two lower insulation pieces, where each lower insulation piece is disposed in a gap between two adjacent lower half-rings, thereby allowing the two adjacent lower half-rings to be electrically insulated from each other.

Further, the electricity introduction assembly further includes two conductive adapters configured to electrically connect the inner terminals of the anode electrode and the cathode electrode in the electrode group, to the corresponding upper conductive ring and lower conductive ring, respectively; and two conductive platens configured to respectively fasten the two conductive adapters to the anode electrode and the cathode electrode in the electrode group correspondingly.

Further, the electricity introduction assembly further includes two insulating protective caps, each insulating protective cap is configured to cover the conductive adapter, the conductive platen, and the inner terminal of the electrode; and two insulation sleeves, telescoped over the anode electrode and the cathode electrode, respectively, and configured to cover a part of the anode electrode and the cathode electrode located at an inner side of heating barrel and a part of the anode electrode and the cathode electrode embedded inside the heating barrel.

Further, the heating tubes are strip-like tubes, a direction of the length of the strip-like tubes is parallel to the axial direction of the heating barrel, and the plurality of strip-like tubes are arranged at intervals along the circumferential direction of the heating barrel.

Further, the supporting assembly further includes an upper ring case, a lower ring case and an outer ring connector, and the upper ring case, the lower ring case, and the outer ring connector are all made of an insulation material.

The upper ring case is disposed outside and covers the upper inner ring; the lower ring case is disposed outside and covers the lower inner ring; the number of the outer ring connectors is at least two, the outer ring connectors are arranged at intervals along, the circumferential, direction of the heating barrel, and each outer ring connector is connected to the upper ring case and the lower ring case, respectively, thereby supporting the upper ring case and the lower ring case.

Further, the upper ring case includes at least two upper outer parts that are connected head-to-tail individually, and any two of the at least two upper outer parts may be detachably connected; the lower ring case includes at least two lower outer parts that are connected head-to-tail individually, any two of the at least two lower outer parts may be detachably connected, and the at least two, upper outer parts are in one-to-one correspondence to the at least two lower outer parts.

Further, the annular heating device includes: a heating wire or a heating pipe, winding around the inner side of the beating barrel to form a barrel-shaped heat source; and the electricity introduction assembly, configured to transmit an electric current to the beating wire or the heating pipe.

Further, the heating chamber further includes a chamber door, and the substrate cassette is replaced by opening the chamber door.

Further, a cooling channel configured to accommodate a cooling medium is disposed in the heating barrel, and the cooling medium is configured to cool the heating barrel.

Further, the heating chamber further includes a temperature control safety device configured to detect a temperature of the heating barrel and emit an alarm signal when the temperature of the heating barrel is higher than a preset safety threshold.

As another aspect of the present disclosure, the present disclosure further provides a semiconductor processing apparatus including a heating chamber, and the heating chamber may be a heating chamber provided by any one of the aforementioned solutions of the present disclosure.

More specifically, the semiconductor processing apparatus further includes a buffer storage area located on a downstream of the heating chamber and configured to store the substrates fetched from the heating chamber that have fulfilled the heating process in the heating chamber.

The present disclosure has the following beneficial effects.

In the beating chamber provided by the present disclosure, in a beating barrel, an annular heating device winding around the inner side of the heating barrel, a substrate cassette configured to hear multiple layers of substrates and arrange the multiple layers of substrates at intervals in an axial direction of the heating barrel, and a substrate cassette lifting device configured to drive the substrate cassette to move up into an internal space defined by the annular heating device or move down to a position corresponding to the substrate transferring window, the multiple layers of substrates arranged at intervals in the vertical direction may be heated simultaneously all at once. Thus, the number of substrates processed per unit time may be multiplied, thereby improving the capacity of the semiconductor processing apparatus. Further, because the annular heating device radiates heat from a periphery of the substrate cassette to each substrate simultaneously, the temperature uniformity between each area of a substrate and between each substrates may be ensured more easily, thereby improving the processing uniformity.

By using the aforementioned heating chamber provided by the present disclosure, the semiconductor processing apparatus provided by the present disclosure may not only simultaneously heat multiple layers of substrates that are arranged at intervals in the vertical direction all at one to multiply the number of substrates processed per unit time, but also ensure temperature uniformity between each area of a substrate and between each substrate more easily, thereby improving the processing uniformity.

DETAILED DESCRIPTION

To make those skilled in the relevant art better understand technical solutions of the present disclosure, a heating chamber and a semiconductor processing apparatus provided by the present disclosure will be described in detail hereinafter with reference to the accompanying drawings.

Figure 2A:
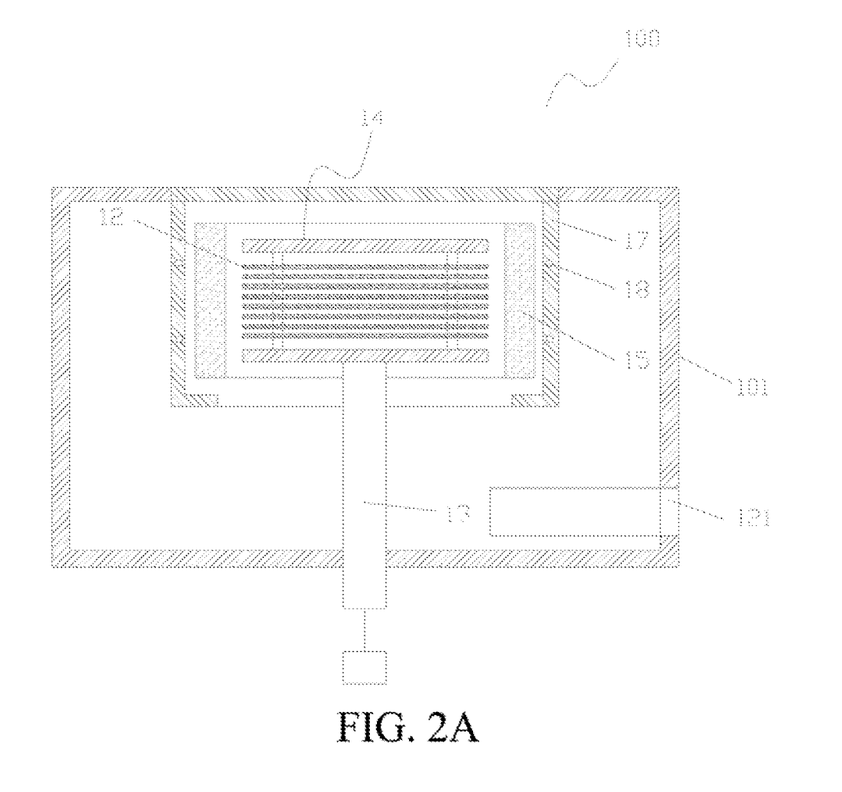
FIG. 2A is a cross-sectional view of a heating chamber provided by embodiments of the present disclosure.
Figure 2B:
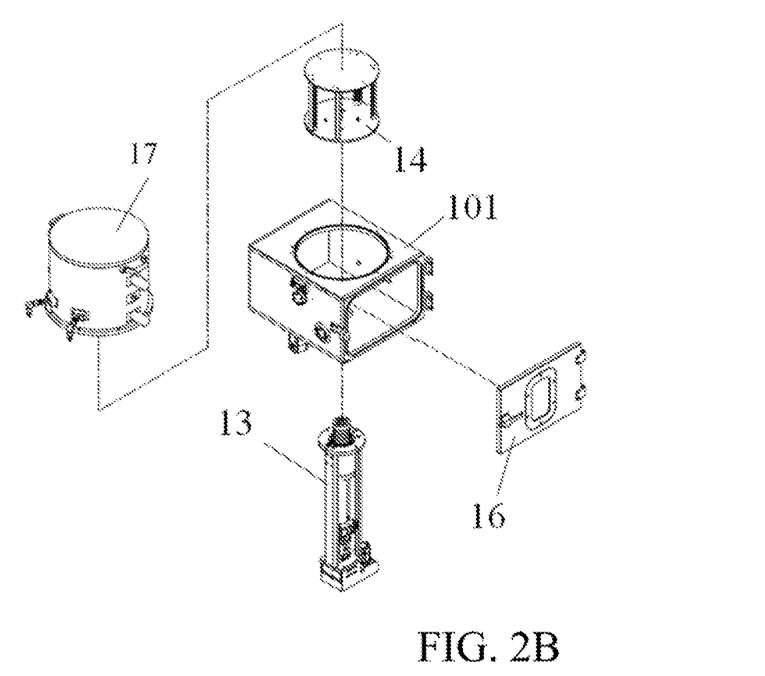
FIG. 2B is a schematic exploded diagram of a heating chamber provided by embodiments of the present disclosure.

FIG. 2A is a cross-sectional view of a heating chamber provided by embodiments of the present disclosure. FIG. 2B is a schematic exploded diagram of a heating chamber provided by embodiments of the present disclosure. Referring to FIGS. 2A and 2B, the heating chamber 100 is defined by a chamber assembly 101, and has a vacuum environment aside. Further, the heating chamber 100 includes a heating barrel 17, an annular heating device 15, a substrate cassette 14 and a substrate cassette lifting device 13. Further, a substrate transferring window 121 allowing a substrate 12 to pass through is disposed in the chamber assembly 101 and below the heating barrel 17. The heating barrel 17 is disposed in the heating chamber 100 and located above the substrate transferring window 121. The annular heating device 15 winds around an inner side of the heating barrel 17 and is configured to radiate heat from a periphery of the heating barrel 17 to an interior of the heating barrel 17. It can be easily understood that, an internal space defined by the heating barrel 17 serves as a processing environment for heating the substrate 12, and the internal space is also a vacuum environment.

The substrate cassette 14 is configured to bear multiple layers of substrates 12 and allow the multiple layers of substrates 12 to be arranged at intervals in an axial direction of the heating barrel 17 to direction perpendicular to surface of the substrates 12). The substrate cassette 14 has a specific structure shown in FIG. 2B. The substrate cassette 14 comprises a ceiling, a base plate, and a plurality of pillars, where a plurality of notches are disposed at intervals in the pillar along an axial direction of the heating barrel 17, thereby supporting the substrates 12. The substrate cassette lifting device 13 is configured to drive the substrate cassette 14 to move up and down, and driven by the substrate cassette lifting device 13, the substrate cassette 14 may move up into the internal space of the heating barrel 17 through an opening at the bottom of the heating barrel 17. By then, the annular heating device 15 winds around the substrate cassette 14, thereby radiating heat towards each substrate in the substrate cassette 14 simultaneously. It should be noted that, because the substrate cassette 14 has a base plate, the base plate may seal the opening at the bottom of the heating barrel 17 by using an appropriate external diameter when the substrate cassette 14 moves up into the internal space of the heating barrel 17. Accordingly, the internal space of the heating barrel 17 forms a relatively-closed independent environment, and further, the disturbance of the external space on the temperature distribution, of the independent environment may be avoided. Obviously, when designing the external diameter of the base plate of the substrate cassette 14, the substrate cassette 14 may be ensured to move up and down smoothly with respect to the heating barrel 17. Even if a gap exists between, the base plate of the substrate cassette 14 and the opening at the bottom of the heating barrel 17, the gap has little influence an the uniformity of temperature distribution of the internal space of the heating barrel 17, and such influence may be omitted.

Further, driven by the substrate cassette lifting device 13, the substrate cassette 14 may move down to a position corresponding to the substrate transferring window 121 from the internal space of the heating barrel 17 through the opening at the bottom of the heating barrel 17. Further, by adjusting a height of the substrate cassette 14 with respect to the substrate transferring window 121, each substrate 12 at different heights may be transferred one by one to a position at the same height as the substrate transferring window 121. The substrate is transferred into the heating chamber 100 using a manipulator through the substrate transferring window 121, and the substrate 12 at a position at the same height as the substrate transferring window 121 is take out.

During a process of performing processing, first, the substrate cassette 14 is driven by the substrate cassette lifting device 13 to move up and down, such that one notch in each pillar of the substrate cassette 14 is moved to a position at the same height as the substrate transferring window 121. Further, a substrate 12 is transferred into the heating chamber 100 through the substrate transferring window 121 by using the manipulator, and is placed into the notch at the same height as the substrate transferring window 121. The foregoing operations are repeated until all of the notches are loaded with a substrate 12. Further, the substrate cassette 14 is driven by the substrate cassette lifting device 13 to move up into the internal space of the heating barrel 17, such as the position where the substrate cassette 14 in FIG. 2A is located. Then, the annular heating device 15 is turned on to, heat the multiple layers of substrates 12 simultaneously. After the heating is finished, the annular heating device 15 is turned off, and the substrate cassette 14 is driven by the substrate cassette lifting device 13 to move down to a position corresponding to the substrate transferring window 121. Further, by adjusting the height of the substrate cassette 14 with respect to the substrate transferring window 121, one of the substrates 12 is moved to the position at the same height as the substrate transferring window 121, and is further moved into the heating chamber 100 through the substrate transferring window 121 using the manipulator. Further, the substrate 12 at the position at the same height as the substrate transferring window 121 is taken out. The foregoing operations are repeated until all or a part of the substrates 12 in the substrate cassette 14 are taken out.

In practical applications, a part of substrates may be taken out from the heating chamber, or all substrates may be taken out based on specific conditions. More specifically, if the number of substrates processed all at once by a device that performs a next processing process is smaller than the number of substrates in the substrate cassette, after a single heating and degassing process is fulfilled, the next processing process may not be performed on all the substrates at once. That is, only a part of the substrates may undergo the next processing process, and the remaining substrates need to stay in the substrate cassette or need to be taken out and placed in a buffer storage area outside of the heating chamber waiting for the next processing process. Preferably, a constant temperature treatment may be performed on the waiting substrates to maximally ensure that the substrates heated in a same batch can satisfy requirements regarding the consistence of the processing result. Further, to ensure that the processing time of the heating and degassing process for each substrate is substantially the same thus further ensuring the consistency of the processing result, the principle of "first in first out" should be obeyed. That is, the substrate that first enters the heating chamber should be moved out first for the next processing process. Here, the substrates heated in a same batch may be moved out of the heating chamber at different moments, thus resulting in different waiting time to wait for the next processing process (if a constant temperature, treatment is applied, the constant temperature periods are different). However, experiments show that different waiting time has a little effect on the processing result of the substrate, and thus the uniformity of the processing result may not be affected.

From aforementioned descriptions, the processing time of the heating chamber provided by embodiments of the present disclosure is not shortened but may even be elongated. That is, the waiting time for the substrate to wait for the next processing process is added. However, from the perspective of the total processing time, because the heating chamber may process multiple layers of substrates simultaneously, the process efficiency is multiplied as compared to the prior art. For example, for a heating chamber in the prior art that can only process one layer of substrate (each layer of substrate(s) may be one substrate or several substrates carried by one tray) all at once, if substrates with a total number corresponding to 10 layers of substrates need to be processed, the heating needs to be performed for ten times. For the heating chamber provided by embodiments of the present disclosure, because the heating chamber may simultaneously heat the multiple layers of substrates (each layer of substrate(s) may be one substrate, or several substrates born by one tray) arranged at intervals in a vertical direction, the number of substrates that are provided per unit time for the next processing process can be multiplied. Further, the issue regarding the capacity of the whole semiconductor processing apparatus being restricted by the step of degassing may be solved.

Figure 3A:
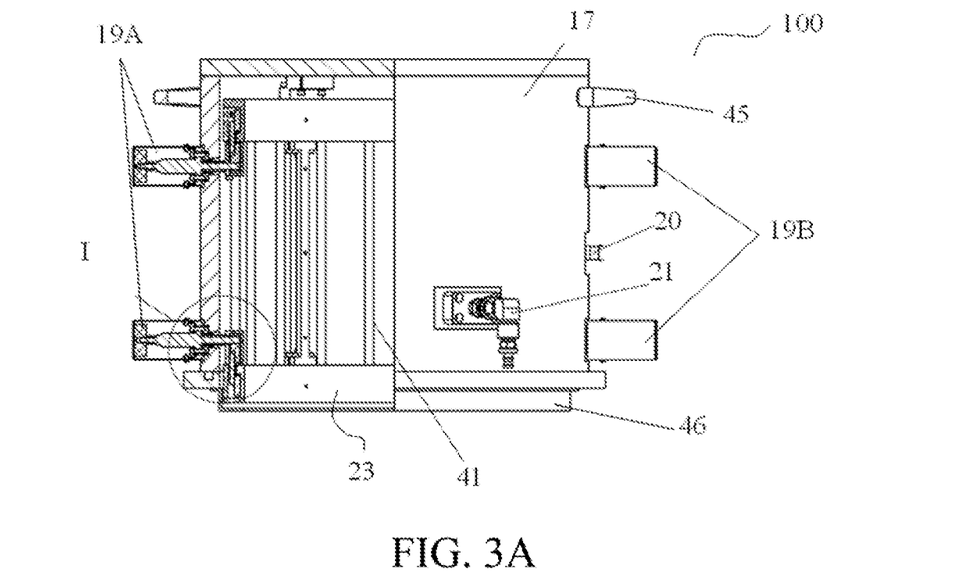
FIG. 3A is a half sectional view of a heating chamber provided by embodiments of the present disclosure.
Figure 3B:
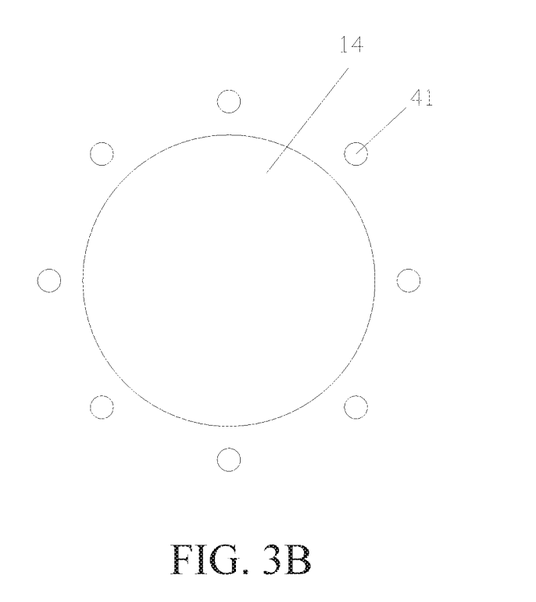
FIG. 3B is a schematic arrangement diagram of heating tubes used in a heating chamber provided by embodiments of the present disclosure.

Hereinafter, a structure of the annular heating device 15 is described in detail. Specifically, referring to FIGS. 3A to 4C, the annular heating device 15 includes a plurality of beating tubes 41, a supporting assembly 23 and an electricity introduction assembly. As shown in FIGS. 3B and 4A, in one embodiment, each beating tube 41 is a strip-like tube, and a direction of the length of the strip-like tube is parallel to an axial direction of the heating barrel 17. Further, the plurality of strip-like tubes are arranged at intervals along a circumferential direction of the heating barrel 17, thereby winding around the inner side of the heating barrel 17 to form a barrel-shaped heat source. Accordingly, the temperature uniformity between each substrate and between each area of a substrate may be easily ensured. Obviously, because the heat obtained by the substrate needs to be gradually transferred from the edge to the center of the substrate itself, the temperature uniformity between each area of the substrate may be ensured as long as there is sufficient time to fulfill heat transfer in the substrate.

Figure 4A:
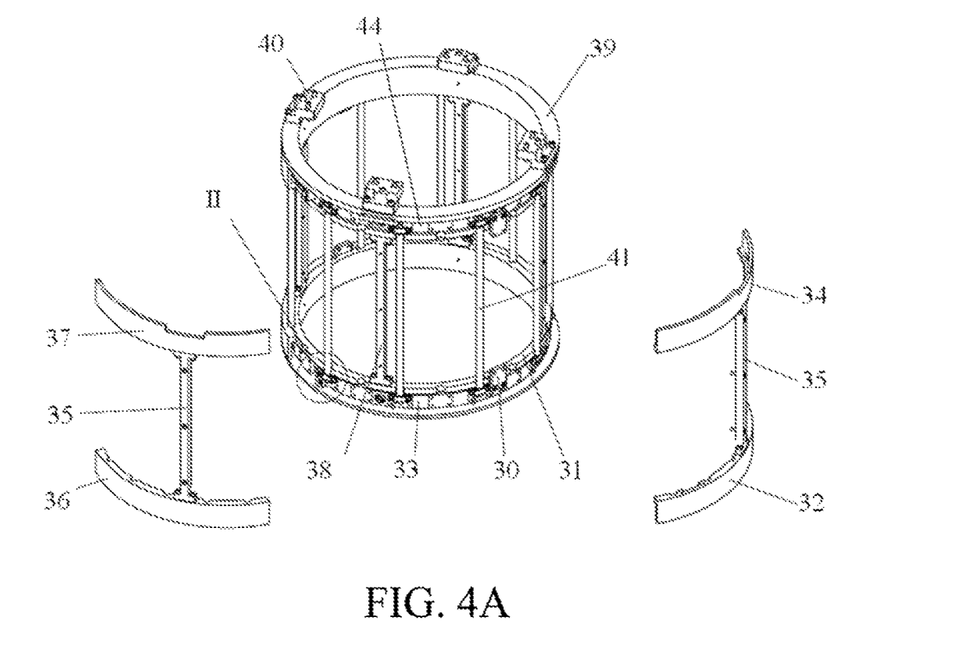
FIG. 4A is a schematic exploded diagram of a supporting assembly used in a heating chamber provided by embodiments of the present disclosure.
Figure 4B:
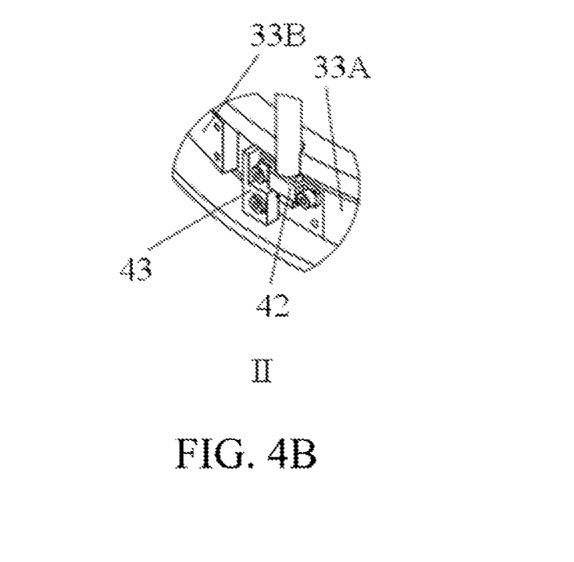
FIG. 4B is an enlarged view of an area II in FIG. 4A.

The supporting assembly 23 is configured to fixedly connect the plurality of heating tubes 41 to the heating barrel 17. Specifically, the supporting assembly 23 includes an upper inner ring 39, a lower inner ring 31 and an inner ring connector 38, and the upper inner ring 39, the lower inner ring 31 and the inner ring connector 38 are all made of an insulation material (e.g., ceramic). The upper inner ring 39 and the lower inner ring 31 are oppositely arranged to each other in the axial direction of the heating barrel 17. Each heating tube 41 is located between the upper inner ring 39 and the lower inner ring 31, and is connected to the upper inner ring 39 and the lower inner ring 31, respectively, through a tube fastener 42, as shown in FIGS. 4A and 4B. Further, the upper inner ring 39 is fixedly connected to the top of the heating barrel 17 via four fasteners 40. The number of inner ring connectors 38 can be various, and the inner ring connectors 38 are arranged at intervals in the circumferential direction or the heating barrel 17. Each inner ring connector 38 is connected to the upper inner ring 39 and the lower inner ring 31, respectively, to support both the upper inner ring 39 and the lower inner ring 31. That is, the inner ring connectors 38 act as supporting columns between the upper inner ring 39 and the lower inner ring 31, such that the upper inner ring 39, the lower inner ring 31 and the inner ring connectors 38 form an annular structure capable of supporting the plurality of heating tubes 41. The inner ring connectors 38 should be arranged to avoid blocking of the heating tubes 41 on the premise that the upper inner ring 39 and the lower inner ring 31 are stably supported.

Preferably, a distance in the axial direction between the upper inner ring 39 and the lower inner ring 31 is larger than a length of the substrate cassette 14 in the axial direction. Accordingly, the substrate 12 close to the ceiling and the base plate of the substrate cassette 14 may be disposed at a position that can be radiated by the heating tube 41 between the upper inner ring 39 and the lower inner ring 31 when the substrate cassette 14 is located at the internal space defined by the annular heating device 15. That is, all the substrates 12 are covered by a radiation area of the heating tubes 41, thereby ensuring the temperature uniformity between each substrate 12.

The electricity introduction assembly is configured to transmit an electric current to each heating tube 41 to light up the heating tubes 41. Specifically, the electricity introduction assembly includes an upper conductive ring 44, a lower conductive ring 33 and an electrode group. The upper conductive ring 44 is disposed around an external side of the upper inner ring 39, and the lower conductive ring 33 is disposed around an external side of the lower inner ring 31. An anode and a cathode of each heating tube 41 are electrically connected to the upper conductive ring 44 and the lower conductive ring 33, respectively; and the electrode group includes an anode electrode and a cathode electrode. Inner terminals (located at one end of the inner side of the heating barrel 17) of the anode electrode and the cathode electrode are electrically connected to the upper conductive ring 44 and the lower conductive ring 33, respectively. Further, outer terminals (located at one end of an external side of the heating barrel 17) of the anode electrode and the cathode electrode are located outside of the heating barrel 17 and are configured to be connected to a power source, it can thus be known that, the electrode group is configured to introduce an electric current provided by the power source, and transmit the electric current to each heating tube 41 at the same time through the upper conductive ring 44 and the lower conductive ring 33. That is, the upper conductive ring 44 and the lower conductive ring 33 respectively function as a positive lead and a negative lead that are shared by all the heating tubes 41, and the heating tubes 41, the upper conductive ring 44, the lower conductive ring 33, the electrode group and the power source form a conductive loop.

Preferably, to avoid the issue of insufficient radiation intensity of the heating tubes 41 induced by insufficient supply of the power supply power that is due to a too large number of heating tubes 41, the heating tubes 41 may be divided into at least two heating tube groups that are independent from each other. Further, the upper conductive ring and the lower conductive ring may be correspondingly divided into a plurality of upper half-rings and a plurality of lower half-rings. Each upper half-ring is in no contact with each other, and each lower half-ring is in no contact with each other. Further, the anode and the cathode of each heating tube 41 in each heating tube group are electrically connected to the upper half-ring and the lower half-ring in one-to-one correspondence with the heating tube group. Simultaneously, the number of the electrode groups is consistent with the number of the heating tube groups, and inner terminals of the anode electrode and the cathode electrode of each electrode group are electrically connected to the upper half-ring and the lower half-ring in one-to-one correspondence with the electrode group. All in all, each heating tube group forms a conductive loop together with a same power source through corresponding upper half-ring, lower half-ring and electrode group. Accordingly, a plurality of heating tube groups form a plurality of conductive loops independent from each other together with different power sources. Thus, the number of heating tubes 41 connected to each power source may be decreased, and the issue of insufficient radiation intensity of the heating tubes $1 due to insufficient supply of the power supply power may be avoided.

Figure 4C:
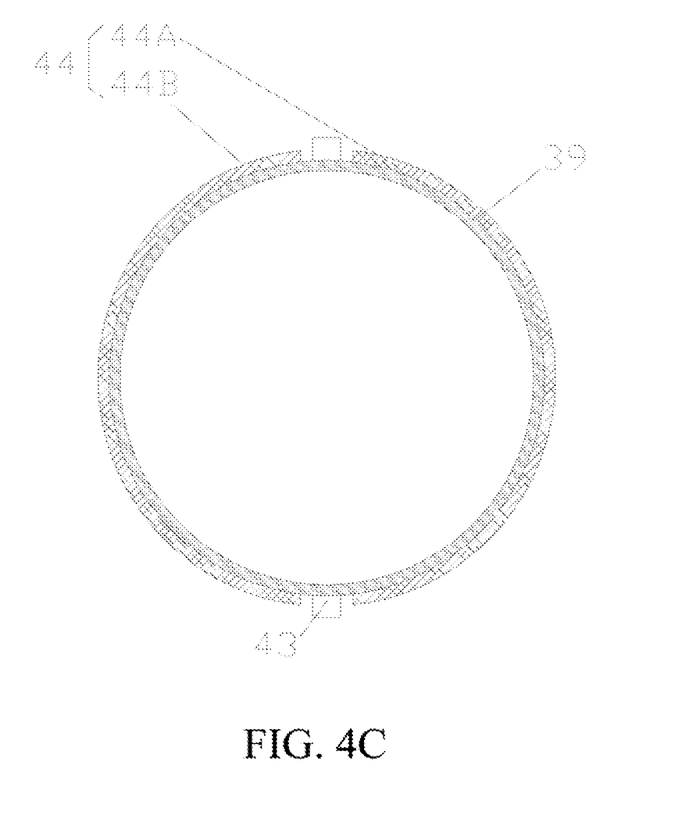
FIG. 4C is a cross-sectional view of an upper conductive ring used in a supporting assembly in FIG. 4A

Further, in one embodiment, the plurality of heating tubes 41 are evenly divided into two heating tube groups, and correspondingly, the upper conductive ring 44 comprises a first upper half-ring and a second upper half-ring (44A and 44B) arranged alternately, as shown in FIG. 4C; the lower conductive ring 33 has a structure similar to that of the upper conductive ring 44 and comprises a first lower half-ring and a second lower half ring (33A and 33B) arranged alternately, as shown in FIG. 4B. The first upper half-ring 44A and the first lower half-ring 33A are opposite to each other, and the second upper half-ring 44B and the second lower half-ring 33B are opposite to each other. Further, the heating tubes 41 in one of the heating tube groups are evenly arranged between the first upper half-ring 44A and the first lower half-ring 33A, and the heating tubes 41 in another heating tube group are evenly arranged between the second upper half-ring 44B and the second lower half-ring 33B. Further, the anode and the cathode of each heating tube 41 are electrically connected to the corresponding upper half-ring and lower half-ring, respectively. Two electrode groups may be used, as shown in FIG. 3A, where a first electrode group 19A is located on the left side of the heating barrel 17, and a second electrode group 19B is located on the right side of the heating barrel 17. More specifically, the inner terminals of the anode electrode and the cathode electrode in the first electrode group 19A are electrically connected to the first upper half-ring 44A and the first lower half-ring 33A, respectively. The inner terminals of the anode electrode and the cathode electrode in the second electrode group 19B are electrically connected to the second upper half-ring 44B and the second lower half-ring 33B, respectively. Thus, the two heating tube groups form two independent conductive loops together with different power sources.

Preferably, the electricity introduction assembly further includes at least two upper insulation pieces and at least two lower insulation. Each upper insulation piece is disposed in a gap between two adjacent upper half-rings to electrically insulate the two adjacent upper half-rings from each other, and each lower insulation piece is disposed in a gap between two adjacent lower half-rings to electrically insulate the two adjacent lower half-rings from each other. Thus, it can be further ensured that there is no electric connection between two adjacent upper half-rings (or lower half-rings). In one embodiment, the electricity introduction assembly includes four insulation pieces 43, where two insulation pieces 43 serve as the upper insulation pieces, and the other two insulation pieces 43 serve as the lower insulation pieces. The two upper insulation pieces are respectively disposed in the two gaps between the first and second upper half-rings (44A, 44B), thereby electrically insulating the first and second upper half-rings (44A, 44B) from each other, as shown in FIG. 4C. The two lower insulation pieces are respectively disposed in the two gaps between the first and second lower half-rings (33A, 33B), thereby electrically insulating the first and second lower half-rings (33A, 33B) from each other, as shown in FIG. 4B.

Figure 3C:
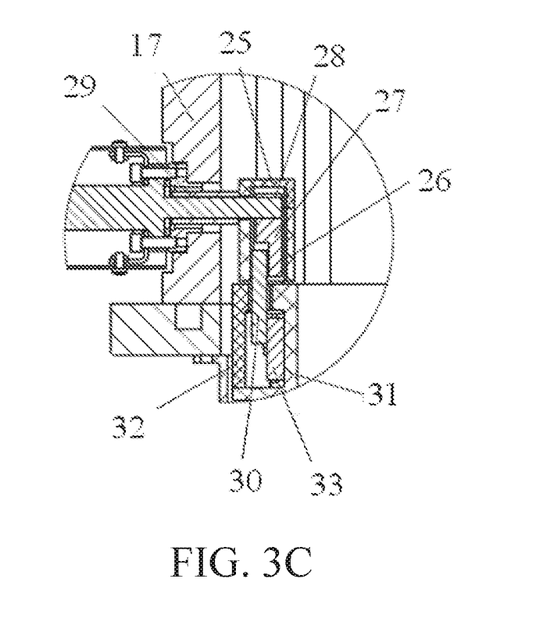
FIG. 3C is an enlarged view of an area I in FIG. 3A.

In the embodiment, as shown in FIG. 3C, the electricity introduction assembly further includes two conductive adapters 27 and two conductive platens 28. The two conductive adapters 27 are configured to electrically connect the inner terminals of the anode electrode and the cathode electrode in the electrode group to the upper conductive ring 44 and the lower conductive ring 33, respectively. It can be easily understood that, take into consideration processing and installation, the electrode group can hardly be disposed at positions close to the top and bottom of the heating barrel 17 and make the inner terminals of the anode electrode and the cathode electrode in the electrode group in direct contact with the upper conductive ring 44 and the lower conductive ring 33. In this case, the inner terminals of the anode electrode and the cathode electrode may be respectively and electrically connected to the upper conductive ring 44 and lower conductive ring 33 by means of the conductive adapters 27. Further, if a distance in the axial direction between the electrode group and the conductive ring is relatively long, a conductive connector 30 may be further disposed to electrically connect each conductive adapter 27 to the upper conductive ring 44 (or the lower conductive ring 33). The two conductive platens 28 are configured to respectively fasten the two conductive adapters 27 to the anode electrode and the cathode electrode in the electrode group correspondingly.

Preferably, the electricity introduction assembly further includes two insulating protective caps and two insulation sleeves 29. Each insulating protective cap is configured as two separated parts (25 and 26) that are able to form a cavity structure and be connected detachably, thereby facilitating assembly/disassembly; each insulating protective cap covers the conductive adapter 27, the conductive platen 28, and the inner terminal of the anode electrode (or the cathode electrode) of the electrode group. The two insulation sleeves 29 are telescoped with the anode electrode and the cathode electrode of the electrode group, respectively, thereby covering the part of the anode electrode and the cathode electrode that is located at an inner side of the heating barrel 17 and the part that is embedded in the heating barrel 17. That is, the part of the anode electrode (or the cathode electrode) located inside the heating barrel 17 is all covered to protect the conductive part of the electrode group, thereby avoiding vacuum sparking. In practical applications, the present disclosure has no particular limit on the structures of the insulating protective caps and the insulation sleeves as long as the insulating protective caps and the insulation sleeves can cover the conductive part and electric connection portion of the electricity introduction assembly in the heating barrel 17.

Preferably, the supporting assembly 23 further includes an upper ring case, a lower ring case and an outer ring connector 35, and the upper ring case, the lower ring case and the outer ring connector are all made of an insulation material. The upper ring case is disposed outside of and covers the upper inner ring 39, and is configured to form a cavity together with the upper inner ring 39, thereby accommodating each component connected onto the upper inner ring 39, such as the anode and cathode of the heating tube 41, the tube fastener 42, a part of the conductive connector 30 connected to the upper conductive ring or lower conductive ring. Similarly, the lower ring case is disposed outside of and covers the lower inner ring 31 to accommodate each component connected onto the lower inner ring 31. The number of the outer ring connectors 35 is at least two, and the outer ring connectors 35 are arranged at intervals in the circumferential direction of the heating barrel 17. Each outer ring connector 35 is respectively connected to the upper ring case and the lower ring case, thereby supporting the upper ring case and the lower ring case.

Preferably, because the heating tubes 41 belong to consumable products and the changing frequency is relatively high, take into consideration the convenience of assembly disassembly, the upper ring case may include at least two upper outer parts, and the at least two upper outer parts may be detachably connected sequentially. The lower ring case may include at least two lower outer parts, and the at least two lower outer parts may be detachably connected sequentially. Further, the at least two upper outer parts and the at least two lower outer parts are in one-to-one correspondence. For example, in one embodiment, the upper ring case comprises four upper outer parts, and the lower ring case comprises four lower outer parts. That is, the upper ring case is evenly divided into four quarter-rings and the lower ring case is evenly divided into four quarter-rings. FIG. 4A schematically illustrates two quarter-rings (34 and 37) of the upper ring case and two quarter-rings (32 and 36) of the lower ring case. As such, when a single heating tube 41 is damaged, only the quarter-ring corresponding to the position of the heating tube 41 needs to be detached, thereby improving the convenience of assembly/disassembly of the heating tubes 41 and facilitating the repair and maintenance of the heating chamber 100. It can be easily understood that, during loading and unloading, the two quarter-rings of the upper ring case and the lower ring case as well as at least one outer ring connector 35 connected to the two quarter-rings can be loaded or unloaded as a whole.

Preferably, the heating chamber 100 provided by embodiments of the present disclosure may further include: a chamber door 16 disposed on the chamber assembly 101. The substrate cassette 14 may be replaced by opening the chamber door 16. In practical applications, the chamber door 16 may be utilized to change the substrate cassette that carries substrates of different sizes, such that the application range of the heating chamber 100 may be broadened.

Preferably, because each beating tube 41 may radiate heat towards the heating barrel 17 while heating the substrates 12, and to prevent the heating barrel 17 from being over heated, the heating chamber 100 may father include a cooling channel 18 disposed in the heating barrel 17. By introducing cooling water into the cooling channel 18, the heating barrel 17 may be cooled. Specifically, the cooling channel 18 has an inlet and an outlet (not shown in the figures), and the inlet and the outlet are respectively connected to two water path connectors 21 that are configured to input and output cooling water, thereby forming circulation cooling. Further, preferably, the heating chamber 100 further includes a temperature control safety device 20 configured to detect a temperature of the heating barrel 17 and emit an alarm signal when the temperature of the heating barrel 17 is higher than a preset safety threshold.

Preferably, a handle 45 is configured on an outer wall of the heating barrel 17, thereby, facilitating installation, disassembly and transportation of the heating barrel 17.

Preferably, a protective ring 46 is disposed at the bottom of the heating barrel 17, thereby protecting the annular heating device 15.

It should, be noted that, in one embodiment, the heating tube 41 is a strip-like tube, but the present disclosure is not limited thereto. In practical applications, the heating tube 41 may be a tube, of any shape such as a helical tube, an annular tube, etc. Further, for heating tubes 41 of different shapes, adaptive designs may be performed on the arrangement methods and electrical connection methods of the heating tubes 41, thereby ensuring the temperature uniformity between each substrate 12 and between each area of the substrate 12. It can be easily understood that, structures of the supporting assembly 23 and the electricity introduction assembly are designed to work with the heating tubes 41. Accordingly, the supporting assembly 23 and the electricity introduction assembly are not limited to the structures provided by embodiments of the present disclosure, and adaptive designs need to be performed based on the arrangement and electrical connection of the heating tubes 41.

It should also be noted that, in practical applications, the arrangement of a plurality of pillars of the substrate cassette 14 is to, not only stably support the substrate 12 but also allow an opening in the substrate cassette 14 that is configured to move the substrate 12 out of the substrate cassette 14 to face towards the substrate transferring window, thereby ensuring that the substrate 12 may be sequentially moved out of the opening of the substrate cassette 14 and the substrate transferring window. Further, the arrangement of the plurality of pillars may further take into consideration the layout of the heating tubes 41, thereby preventing the light radiated by the heating tubes 41 to be blocked.

Figure 5:
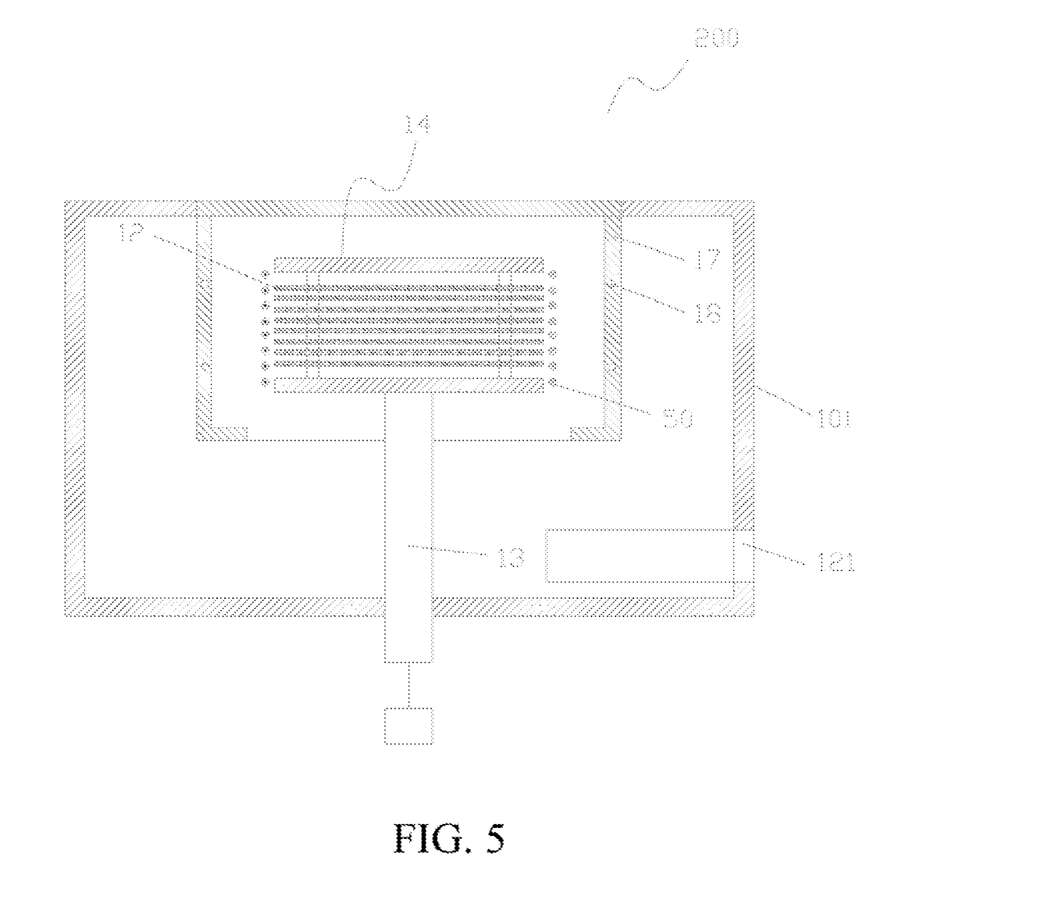
FIG. 5 is a cross-sectional view of a heating chamber provided by a modified embodiment according to embodiments of the present disclosure.

As a modified embodiment of the aforementioned embodiment, the present disclosure further provides a heating chamber shown in FIG. 5. Referring to FIG. 5, with respect to the aforementioned embodiment, the heating chamber 200 provided by the modified embodiment may similarly includes a heating barrel 17, an annular heating device, a substrate cassette 14 and a substrate cassette lifting device 13. Structures and functions of the aforementioned components or devices are the same as that in the above embodiments, and thus are not repeated herein. Hereinafter, only differences between the heating chamber 200 provided by the modified embodiment, and that illustrated in the above embodiment are described in detail.

Specifically, in the heating chamber 200 provided by the present modified embodiment, the annular heating device includes a heating wire (or heating pipe) 50 that spirally winds along the circumferential direction of the heating barrel 17 to form a barrel-shaped heat source for radiating heat from the periphery of the heating barrel 17 to the interior of the heating barrel 17. Accordingly, the heat can be radiated simultaneously towards each substrate 12 in the substrate cassette 14. It can be easily understood that, to improve the heating efficiency of the heating wire (or heating pipe) 50, an inner wall of the barrel-shaped structure formed by winding the heating wire (or heating pipe) 50 needs to be as close as possible to the substrate cassette 14 without impeding up-down movement of the substrate cassette 14.

It should be noted that, in one embodiment, the heating wire (or heating pipe) 50 spirally winds along the circumferential direction of the heating barrel 17 to form a barrel-shaped heat source, but the present disclosure is not limited thereto. In practical applications, the heating wire (or heating pipe) 50 may be wound in any other methods, as long as the barrel-shaped heat source is formed around an inner side of the heating barrel 17 to evenly radiate the heat towards the interior of the heating barrel 17. Further, the number of the heating wires (or heating pipe) 50 may be one, i.e., one heating wire (heating pipe) is wound to form the barrel-shaped structure. Or, the number of the heating wires (or heating pipes) 50 may be two or more, the two or more heating wires (heating pipes) 50 may be electrically connected or independent from each other, and are evenly arranged at the inner side of the heating barrel 17 to form the barrel-shaped heat source.

As another technical solution, the present disclosure further provides a semiconductor processing apparatus including a heating chamber, where the heating chamber may use a heating chamber provided, by any aforementioned embodiment of the present disclosure.

Preferably, the semiconductor processing apparatus includes a buffer storage area. The buffer storage area may be located on the downstream of the heating chamber and be configured to store the substrates from the heating chamber that have fulfilled the heating process in the heating chamber. By virtue of the buffer storage area, the substrates that await the next processing process may be placed when the number of the substrates that can be processed all at once by a device for performing the next processing process is smaller than the number of the substrates in the substrate cassette.

By using the heating chamber provided by any one of the aforementioned embodiments of the present disclosure, the semiconductor processing apparatus provided by embodiments of the present disclosure not only realizes simultaneous heating of multiple layers of substrates arranged at intervals in the vertical direction all at once to multiply the number of substrates processed per unit time, but also ensure the temperature uniformity between each area of a substrate and between each substrate more easily, thereby improving the processing uniformity.

It could be understood that the above implementations are only exemplary implementations for illustrating the principle of the present disclosure however, the present disclosure is not limited thereto. Various variations and improvements can be made by those ordinarily skilled in the relevant art without departing from the spirit and essence of the present disclosure, and these variations and improvements shall all fall within the protection scope of the present disclosure.

What is claimed is:

1. A heating chamber, having a vacuum environment inside and comprising a substrate transferring window for a substrate to pass through, the heating chamber comprising:
   a heating barrel, disposed in the heating chamber and located above the substrate transferring window;
   an annular heating device, fixedly connected to the heating barrel and disposed around an inner side of the heating barrel, and configured to radiate heat from a periphery of the heating barrel to an interior of the heating barrel, comprising:
      a plurality of heating tubes, arranged along a circumferential direction of the heating barrel to form a barrel-shaped heat source; and
      a supporting assembly, configured to fasten the plurality of heating tubes, including an upper inner ring, a lower inner ring, and a plurality of inner ring connectors, wherein:
         each of the upper inner ring, the lower inner ring, and the plurality of inner ring connectors is made of an insulation material,
         the upper inner ring and the lower inner ring are disposed opposite to each other in an axial direction of the heating barrel, and each of the plurality of heating tubes is located between the upper inner ring and the lower inner ring and is fixedly connected to the upper inner ring and the lower inner ring, respectively, and
         the plurality of inner ring connectors are arranged at intervals in the circumferential direction of the heating barrel, and each of the plurality of inner ring connectors is connected to the upper inner ring and the lower inner ring, respectively, for supporting the upper inner ring and the lower inner ring;
   a substrate cassette, configured to bear a plurality of layers of substrates and allow the plurality of layers of substrates to be arranged at intervals in the axial direction of the heating barrel; and
   a substrate cassette lifting device, configured to drive the substrate cassette to move up into an internal space defined by the annular heating device, or move down to a position corresponding to the substrate transferring window.

2. The heating chamber according to claim 1, wherein the annular heating device further comprises:
   an electricity introduction assembly, configured to transmit an electric current to the plurality of heating tubes.

3. The heating chamber according to claim 2, wherein the electricity introduction assembly comprises an upper conductive ring, a lower conductive ring and an electrode group, wherein:
   the upper conductive ring is disposed around an external side of the upper inner ring, and the lower conductive ring is disposed around an external side of the lower inner ring, and an anode and a cathode of each heating tube are electrically connected to the upper conductive ring and the lower conductive ring, respectively; and
   the electrode group comprises an anode electrode and a cathode electrode, inner terminals of the anode electrode and the cathode electrode are correspondingly and simultaneously connected to the anode and the cathode of each heating tube through the upper conductive ring and the lower conductive ring, and outer terminals of the anode electrode and the cathode electrode are located outside of the heating barrel.

4. The heating chamber according to claim 3, wherein the plurality of heating tubes are evenly divided into at least two heating tube groups; and correspondingly, the upper conductive ring and the lower conductive ring are respectively divided into at least two upper half-rings and at least two lower half-rings having no contact with each other; a number of the electrode groups is consistent with a number of the heating tube groups; and the anode and cathode of each heating tube in each heating tube group are respectively and electrically connected to the upper half-ring and the lower half-ring in one-to-one correspondence with the heating tube group; and inner terminals of the anode electrode and the cathode electrode of each electrode group are electrically connected to the upper half-ring and the lower half-ring in one-to-one correspondence with the electrode group.

5. The heating chamber according to claim 4, wherein the electricity introduction assembly further comprises:

at least two upper insulation pieces, each upper insulation piece being disposed in a gap between two adjacent ones of the upper half-rings, thereby electrically insulating the two adjacent ones of the upper half-rings from each other; and at least two lower insulation pieces, each lower insulation piece being disposed in a gap between two adjacent ones of the lower half-rings, thereby electrically insulating the two adjacent ones of the lower half-rings from each other.

6. The heating chamber according to claim 3, wherein the electricity introduction assembly further comprises:

two conductive adapters, configured to respectively and electrically connect the inner terminals of the anode electrode and the cathode electrode in the electrode group to the upper conductive ring and the lower conductive ring correspondingly; and two conductive platens, configured to respectively fasten the two conductive adapters to the anode electrode and the cathode electrode in the electrode group correspondingly.

7. The heating chamber according to claim 6, wherein the electricity introduction assembly further comprises:

two insulating protective caps, each insulating protective cap being configured to cover the conductive adapter, the conductive platen, and the inner terminal of the electrode; and two insulation sleeves, telescoped with the anode electrode and the cathode electrode, respectively, and configured to cover a part of the anode electrode and the cathode electrode located at an inner side of the heating barrel and a part of the anode electrode and the cathode electrode embedded inside the heating barrel.

8. The heating chamber according to claim 1, wherein each of the plurality of heating tubes is a strip-like tube, a direction of a length of the strip-like tube is parallel to the axial direction of the heating barrel, and the plurality of strip-like tubes are arranged at intervals along the circumferential direction of the heating barrel.

9. The heating chamber according to claim 1, wherein the supporting assembly comprises an upper ring case, a lower ring case and outer ring connectors, wherein:

each of the upper ring case, the lower ring case, and the outer ring connectors is made of an insulation material;

the upper ring case is disposed outside of the upper inner ring;

the lower ring case is disposed outside of the lower inner ring; and a number of the outer ring connectors is at least two, the outer ring connectors are arranged at intervals along the circumferential direction of the heating barrel, and each outer ring connector is connected to the upper ring case and the lower ring case, respectively, to support the upper ring case and the lower ring case.

10. The heating chamber according to claim 9, wherein the upper ring case comprises at least two upper outer parts connected head-to-tail, and any two of the at least two upper outer parts are detachably connected; the lower ring case comprises at least two lower outer parts connected head-to-tail, and any two of the at least two lower outer parts are detachably connected, and the at least two upper outer parts and the at least two lower outer parts are in one-to-one correspondence.

11. The heating chamber according to claim 2, wherein the annular heating device comprises:

a heating wire or a heating pipe, spirally winding around an inner side of the heating barrel to form a barrel-shaped heat source;

wherein the electricity introduction assembly is configured to transmit an electric current to the heating wire or the heating pipe.

12. The heating chamber according to claim 1, wherein the heating chamber further comprises a chamber door, and the substrate cassette is replaced by opening the chamber door.

13. The heating chamber according to claim 1, wherein a cooling channel is further configured in the heating barrel for accommodating a cooling medium, and the cooling medium is configured to cool the heating barrel.

14. The heating chamber according to claim 1, wherein the heating chamber further comprises:

a temperature control safety device, configured to detect a temperature of the heating barrel and emit an alarm signal when the temperature of the heating barrel is higher than a preset safety threshold.

15. A semiconductor processing apparatus, comprising a heating chamber having a vacuum environment inside and including a substrate transferring window for a substrate to pass through, wherein the heating chamber further comprises:

a heating barrel, disposed in the heating chamber and located above the substrate transferring window;

an annular heating device, fixedly connected to the heating barrel and disposed around an inner side of the heating barrel, and configured to radiate heat from a periphery of the heating barrel to an interior of the heating barrel, comprising:

a plurality of heating tubes, arranged along a circumferential direction of the heating barrel to form a barrel-shaped heat source; and a supporting assembly, configured to fasten the plurality of heating tubes, including an upper inner ring, a lower inner ring, and a plurality of inner ring connectors, wherein:

each of the upper inner ring, the lower inner ring, and the plurality of inner ring connectors is made of an insulation material, the upper inner ring and the lower inner ring are disposed opposite to each other in an axial direction of the heating barrel, and each of the plurality of heating tubes is located between the upper inner ring and the lower inner ring and is fixedly connected to the upper inner ring and the lower inner ring, respectively, and the plurality of inner ring connectors are arranged at intervals in the circumferential direction of the heating barrel, and each of the plurality of inner ring connectors is connected to the upper inner ring and the lower inner ring, respectively, for supporting the upper inner ring and the lower inner ring;

a substrate cassette, configured to bear a plurality of layers of substrates and allow the plurality of layers of substrates to be arranged at intervals in the axial direction of the heating barrel; and a substrate cassette lifting device, configured to drive the substrate cassette to move up into an internal space defined by the annular heating device, or move down to a position corresponding to the substrate transferring window.

16. The semiconductor processing apparatus according to claim 15, further comprising a buffer storage area located on a downstream of the heating chamber and configured to store a substrate fetched from the heating chamber that have fulfilled a heating process in the heating chamber.

17. The semiconductor processing apparatus according to claim 15, wherein the annular heating device further comprises:

an electricity introduction assembly, configured to transmit an electric current to the plurality of heating tubes.

18. The semiconductor processing apparatus according to claim 17, wherein the electricity introduction assembly comprises an upper conductive ring, a lower conductive ring and an electrode group, wherein:

the upper conductive ring is disposed around an external side of the upper inner ring, and the lower conductive ring is disposed around an external side of the lower inner ring, and an anode and a cathode of each heating tube are electrically connected to the upper conductive ring and the lower conductive ring, respectively; and the electrode group comprises an anode electrode and a cathode electrode, inner terminals of the anode electrode and the cathode electrode are correspondingly and simultaneously connected to the anode and the cathode of each heating tube through the upper conductive ring and the lower conductive ring, and outer terminals of the anode electrode and the cathode electrode are located outside of the heating barrel.

* * * * *